(12) United States Patent
Michellys

(10) Patent No.: US 8,384,102 B2
(45) Date of Patent: Feb. 26, 2013

(54) OLED OR GROUP OF ADJACENT OLEDS WITH A LIGHT-EXTRACTION LAYER EFFICIENT OVER A LARGE RANGE OF WAVELENGTHS

(75) Inventor: Jean-Yves Michellys, Forcalquier (FR)

(73) Assignee: Thomson Licensing (FR)

( * ) Notice: Subject to any disclaimer, the term of this patent is extended or adjusted under 35 U.S.C. 154(b) by 676 days.

(21) Appl. No.: 12/587,049

(22) Filed: Oct. 1, 2009

(65) Prior Publication Data

US 2010/0084677 A1    Apr. 8, 2010

(30) Foreign Application Priority Data

Oct. 3, 2008  (EP) .................................. 08305637

(51) Int. Cl.
*H01L 29/72* (2006.01)
(52) U.S. Cl. .................... 257/98; 257/40; 257/E51.018; 313/504
(58) Field of Classification Search .............. 257/40, 257/98, E51.018; 313/504
See application file for complete search history.

(56) References Cited

U.S. PATENT DOCUMENTS

2008/0122348 A1* 5/2008 Jeong et al. ................... 313/504
2008/0129191 A1   6/2008 Lee et al.

FOREIGN PATENT DOCUMENTS

JP          2007/234253      9/2007
WO     WO2006/054137      5/2006

OTHER PUBLICATIONS

Ran et al.:"Role of the dielectric capping layer in enhancement of light outcoupling for semitransparent metal-cathode organic light-emitting devices." Journal of Optics A: Pure and Applied Optics, vol. 8, Jul. 13, 2006, pp. 733-773, XP002518366.
Zhu et al.: "High-performance top-emitting white organic light-emitting devices." Japanese Journal of Applied Physics, vol. 46, No. 7a, Jun. 4, 2007, pp. 4054-4058, XP002518367.
European Search Report dated Mar. 25, 2009.

* cited by examiner

*Primary Examiner* — Edward Wojciechowicz
(74) *Attorney, Agent, or Firm* — Jack Schwartz and Associates, PLLC

(57) ABSTRACT

An organic light emitting diode comprises, between a bottom electrode and a top electrode, an organic light-emitting layer and a light-extraction enhancement layer made of a dielectric material. According to the invention, if $n_D$, is the optical index of said dielectric material, and if $\lambda_M$ is the center of the range of wavelengths of the emitted light, the thickness of the light-extraction enhancement layer is approximately equal to $5.\lambda_M/8.n_D$. Thank to the invention, light extraction is enhanced in a range of wavelengths superior or equal to 150 nm.

7 Claims, 2 Drawing Sheets

OLED OR GROUP OF ADJACENT OLEDS WITH A LIGHT-EXTRACTION LAYER EFFICIENT OVER A LARGE RANGE OF WAVELENGTHS

This application claims the benefit, under 35 USC §119 of European Patent Application No. 08305637.4, filed Oct. 3, 2008.

FIELD OF THE INVENTION

The invention relates to an organic light emitting diode (OLED) comprising, between a bottom electrode and a top electrode, at least one organic layer that is able to emit light through one of these electrodes when an electric current is injected through this organic layer by said electrodes. The electrode though which this OLED can emit light should then be semi-transparent, i.e. transparent enough to let the emitted light escape from the OLED.

DESCRIPTION OF PRIOR ART

In order to improve light extraction emitted by the organic light-emitting layer through this semi-transparent electrode, it is a known technique, in the OLED structures, to use an optical cavity effect between the bottom electrode and the top electrode, as soon as these electrodes are at least partially reflective: if $\lambda_E$ is the emitted wavelength, if $n_O$ is the optical index of the organic material between the electrodes, by properly choosing the distance between these two electrodes around $\lambda_E/2.n_O$ possibly corrected with the penetration of light inside the electrodes, light extraction is improved. Generally, one of the electrodes is totally reflective and made of metal as Al or Ag, and the other electrode is semi-reflective, i.e. semi-transparent.

In order to still improve light extraction from the OLED, it is also a known technique to cover the semi-transparent electrode by a dielectric layer of high index with a thickness of about $\lambda_E/4.n_D$, where $n_D$ is the optical index of the dielectric material that is generally superior to 1.8. Such a dielectric layer is then a light-extraction enhancement layer. The documents EP1076368, EP1439589, EP1443572, and US2007-159087 disclose organic light emitting diodes with such dielectric layers. Such a layer is called "Capping layer" by IBM, "absorption-reduction layer" by Kodak, "outcoupling enhancement layer" by Novaled, "index-matching layer" by HannStar.

A problem is that this light-extraction enhancement technique works only for a limited range of wavelengths, for instance between 490 and 580 nm (taking the 50% attenuation points) when $\lambda_E$=535 nm. Therefore, for an OLED having a large range of wavelengths of emission, for instance a range superior or equal to 150 nm, notably for white-emitting organic diodes, this light-extraction enhancement technique does not work well, as it is not possible to fulfill the above condition concerning the thickness of the dielectric layer for the whole range of wavelengths. Consequently, this light-extraction enhancement technique is difficult to apply for OLED having a stack of different electroluminescent layers emitting wavelengths that are distributed on a range of wavelengths larger then 150 nm. Nevertheless, it has to be noted that the document US2008/122348 proposes light transmittance controlled layers made of dielectric material which are efficient for large range of wavelengths. The document entitled "Role of the dielectric capping layer in enhancement of light outcoupling for semi-transparent metal-cathode organic light-emitting devices", authored by G. Z. Ran et al, published on Jul. 13, 2006 in the Journal of Optics A: pure and applied optics, Vol. 8, pp. 733-736, discloses "enhanced outcoupling" dielectric layers that are efficient for a broadband emitter as Alq3.

The above-mentioned light-extraction enhancement technique is also difficult to apply for a group of OLEDs, as, for instance, a group forming a pixel of a display device and comprising a R_OLED, a G_OLED, and a B_OLED having respective emission wavelengths around 630 nm, 530 nm, and 440 nm; as a matter of fact, the range of emission wavelengths is too large to have the same thickness for the light-extraction enhancement layer over these three different diodes of the same group, and one should adjust the thickness of the light-extraction enhancement layer separately for each of the OLED of this group. Not only will this increase the equipment cost and cycle time, but this may require a shadow mask for the deposition of the light-extraction enhancement layer, what is problematic as such masks can generally not be used with high resolution and large sizes; this may even not be possible if the organic electroluminescent layers corresponding to the different colors R, G and B are stacked full plane layers.

SUMMARY OF THE INVENTION

An object of the invention is to propose a light-extraction enhancement layer that is adapted to enhance light extraction in a range of wavelengths larger or equal to 150 nm. According to the invention, instead of using a thickness of about $\lambda_E/4.n_D$ as before for this light-extraction enhancement layer, it is proposed to use a thickness of either about $\lambda_M/8.n_D$, about $5.\lambda_M/8.n_D$ or about $9.\lambda_M/8.n_D$, where $\lambda_M$ is a central emission wavelength within said range of wavelengths. Preferably, this thickness is about $5.\lambda_M/8.n_D$, for which the best enhancements of light extraction have been obtained. Preferably, the central emission wavelength within said range of wavelengths corresponds to the average wavelength in this range weighted by the light intensity of the emitted visible light encompassing the emitted visible light from all organic light-emitting layer(s).

For this purpose, the subject of the invention is a group of at least one organic light emitting diode, wherein each diode of this group comprises, in an interval limited by a bottom electrode and a top electrode, at least one organic light-emitting layer that is adapted to emit visible light though one of said electrodes that is semi-transparent, wherein the light intensity of the emitted visible light encompassing the emitted visible light of all organic light-emitting layer(s) of the diode(s) of said group is distributed over a range of wavelengths that is superior or equal to 150 nm, wherein a weighted average wavelength $\lambda_M$ is defined which corresponds to the average wavelength in this range weighted by said light intensity, wherein said group comprises a light-extraction enhancement layer made of a dielectric material, which is located outside said interval of each diode of this group, which is directly adjacent to the electrode of each diode of this group that is semi-transparent, and wherein, if $n_D$ is the optical index of said dielectric material, the thickness of said light-extraction enhancement layer is equal to $5.\lambda_M/8.n_D$ with a margin of ±10%.

For the evaluation of the weighted average wavelength $\lambda_M$, the light emitted by all organic light-emitting layers is considered, whatever they belong to the same diode or to different diodes. The weighted average wavelength $\lambda_M$ corresponds generally to about the center of the said range of wavelengths.

When being "directly adjacent" to a semi-transparent electrode of a diode as stated above, the light-extraction enhancement layer is in direct contact with this electrode over the entire surface of this electrode through which light is emitted by this diode.

The subject of the invention is also an organic light emitting diode comprising, in an interval limited by a bottom electrode and a top electrode, at least one organic light-emitting layer that is adapted to emit visible light though one of said electrodes that is semi-transparent, said emitted visible light having a distribution of wavelengths extending in a range of wavelengths superior or equal to 150 nm, and a light-extraction enhancement layer made of a dielectric material, which is located outside said interval between electrodes and which is directly adjacent to the electrode that is semi-transparent, wherein, if $n_D$ is the averaged optical index of said dielectric material in said range of wavelengths, and if $\lambda_M$ is the center of said range of wavelengths, the thickness of said light-extraction enhancement layer is equal to $5.\lambda_M/8.n_D$ with a margin of ±10%.

The center of said range of wavelengths corresponds preferably to the average wavelength in this range weighted by the light intensity of the emitted visible light encompassing the emitted visible light from all organic light-emitting layer(s) of this diode.

FIG. 1 illustrates an example of a group of one diode according to the invention, where this diode is here top-emitting and comprises a glass substrate 1, an opaque and reflective bottom electrode 2 made of silver having a thickness of about 100 nm, a group of stacked organic layers 3 having a thickness of about 105 nm, a semi-transparent and semi-reflective top electrode 4 made of silver having a thickness of about 20 nm, and a light-extraction enhancement layer 5 contacting the top electrode on its whole surface, made of a dielectric material. The group of stacked organic layers is adapted in a manner known per se such that, when a current is injected through these organic layers by the electrodes, a white visible light is emitted by this group of stacked organic layers, which is distributed in a range of wavelengths extending from 465 nm to 605 nm, i.e. from the blue up to the red. The weighted average wavelength $\lambda_M$ of this range of wavelengths is then about 535 nm.

FIG. 2 illustrates the light emitting efficiency in Candela per Ampere (cd/A) of the diode of FIG. 1 when the thickness of the light-extraction enhancement layer 5 varies, this thickness being expressed as a multiple of $\lambda_M/8.n_D$, where $n_D$ is the averaged optical index of the dielectric material that has been used for the light-extraction enhancement layer. More precisely, the vertical axis of FIG. 2 represents, for a given diode, the lowest efficiency (cd/A) found inside the range 465 to 605 nm. This figure shows three maxima of efficiency, a first maximum corresponding to an optimum thickness of $\lambda_M/8.n_D$, a preferable second maximum corresponding to an optimum thickness of $5.\lambda_M/8.n_D$, and a third maximum corresponding to an optimum thickness of $9.\lambda_M/8.n_D$. If applied to a dielectric material as TeO2, having an averaged optical index $n_D$=2.3, the optimum thicknesses would be respectively 29 nm, preferably 145 nm and 262 nm. The last thickness (262 nm) is practically too high and will be preferably avoided.

With a same presentation as FIG. 2, FIG. 3 illustrates the variation of the curve of FIG. 1 with different values of the averaged optical index $n_D$, from 1.9 to 2.3. One can infer from the different curves of FIG. 3 that the optimum preferable thickness $5.\lambda_M/8.n_D$ varies slightly from −5% to +2.5% when $n_D$ varies from 1.9 to 2.3.

It has been checked that the same rules as above apply for bottom emitting diodes.

Preferably, at least one of the organic light emitting diodes of the group comprises a plurality of stacked organic light-emitting layers, each adapted to emit visible light, and said range of wavelengths encompasses the wavelengths of visible light which can be emitted by each of the stacked organic light-emitting layers.

Similarly, the subject of the invention is also a group of a plurality of adjacent organic light emitting diodes disposed side by side, each comprising, in an interval limited by a bottom electrode and a top electrode, at least one organic light-emitting layer that is adapted to emit visible light though one of said electrodes that is semi-transparent, wherein the emitted visible light of all the organic light emitting diodes of this group is distributed in a range of wavelengths that is superior or equal to 150 nm, wherein it comprises a light-extraction enhancement layer made of a dielectric material, which is located outside said interval of each diode of this group, which overlaps and contacts directly the electrode of each diode of this group that is semi-transparent, and wherein, if $n_D$ is the optical index of said dielectric material and if $\lambda_M$ is the center of said range of wavelengths, the thickness of said light-extraction enhancement layer is equal to $5.\lambda_M/8.n_D$ with a margin of ±10%. Such a group of adjacent diodes shares the same light-extraction enhancement layer that is efficient to enhance light extraction for each of the diodes of this group.

Overlapping and contacting directly each of the bottom electrodes or each of the top electrodes of the organic light emitting diodes of the group, the light-extraction enhancement layer is directly adjacent to all of these bottom electrodes or top electrodes. The organic light emitting diodes of this group are located beside one another such that they share the same light-extraction enhancement layer.

The center of said range of wavelengths corresponds preferably to the average wavelength in this range weighted by the light intensity of the emitted visible light encompassing the emitted visible light from all organic light-emitting layer(s) of the different diodes of the group.

Thank to the invention, the light-extraction enhancement layer is adapted to enhance light extraction in a range of wavelengths larger or equal to 150 nm.

Such an organic light emitting diode or such a group of adjacent organic light emitting diodes is preferably white emitting.

Such an organic light emitting diode or such a group of adjacent organic light emitting diodes is preferably used for lighting application or for display application.

Preferably, said dielectric material is selected in the group consisting of ZrO2, LiNbO3, SiO, SnO2, PbF2 and Sb2O3. The optical index of the dielectric materials of this group is around 2.

Preferably, said dielectric material is selected in the group consisting of ZnSe), ZnS, SnS, TeO2 and TiO2. The optical index of the dielectric materials of this group is superior or equal to 2.3.

Preferably, said interval(s) between electrodes is an optical cavity. When an interval between a bottom electrode and a top electrode is an optical cavity, it generally imply that:
one of these electrodes is reflective, preferably made of a metal, and the other one is partially reflective;
the distance between these two electrodes is a multiple of $\lambda_E/2.n_O$, possibly corrected with the penetration of light inside the electrodes, where $\lambda_E$ is the wavelength of visible light emitted by the at least one organic light-emitting layer comprised in said interval, and $n_O$ is the optical index of material in this interval.

The subject of the invention is also a lighting or display panel comprising a plurality of organic light emitting diodes or groups of organic light emitting diodes according to the invention.

BRIEF DESCRIPTION OF THE DRAWINGS

The invention will be more clearly understood on reading the description which follows, given by way of a non-limiting example and with reference to the appended figures in which.

DESCRIPTION OF THE PREFERRED EMBODIMENTS

Figure 1:
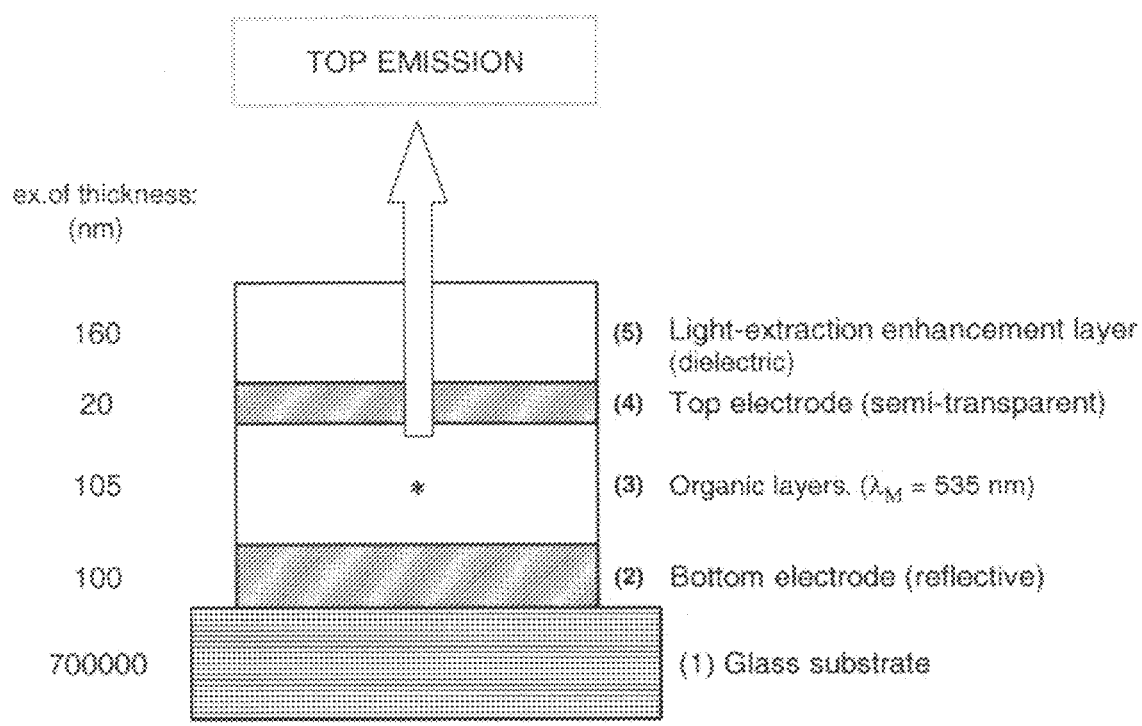
FIG. 1 illustrates an organic light emitting diode according to an embodiment of the invention.
Figure 2:
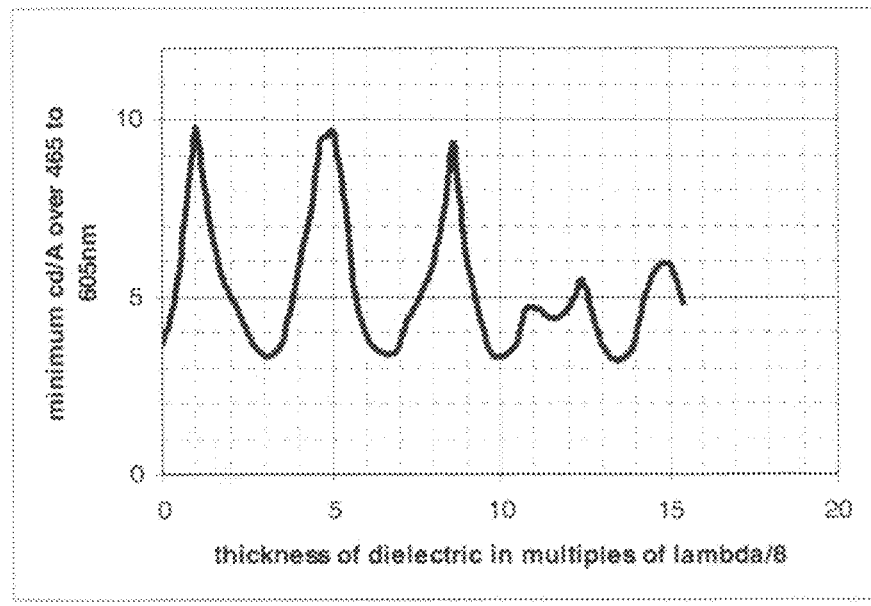
FIGS. 2 and 3 illustrate the light emitting efficiency (cd/A) of the diode of FIG. 1 when the thickness of the light-extraction enhancement layer 5 varies. The different curves on FIG. 3 correspond to different dielectric material and different material for the top electrodes.
Figure 3:
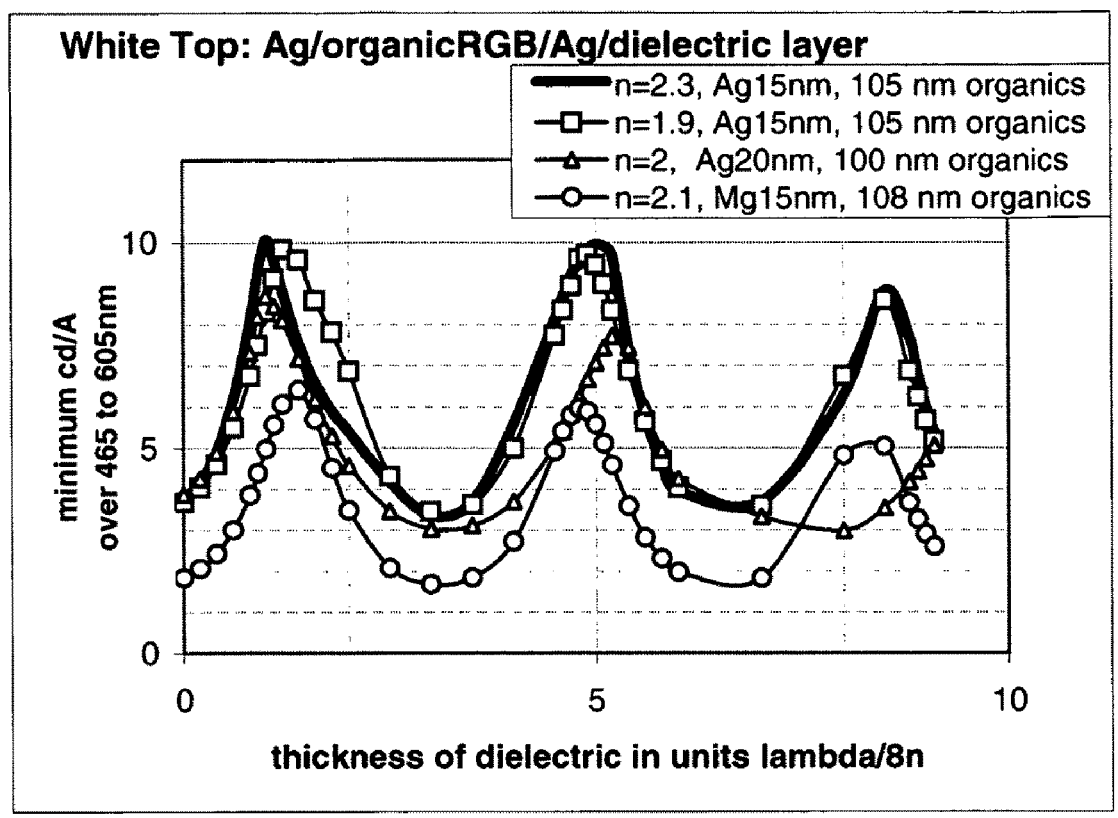

Example 1 below illustrates the invention. Reference example 1 is presented for comparison with the prior art. Identical references will be used for the layers which provide the same functions.

REFERENCE EXAMPLE 1

White Bottom-emitting Organic Diode According to Prior Art

A glass substrate 1 received from Asahi Glass (0.7 mm glass/155 nm ITO polished/230 nm Cr) is first cleaned in de-ionized water then patterned by photolithography (NMP strip); following these steps the active area is a free 3 mm disc of ITO, forming a bottom electrode 2 acting as an anode; on the inactive area, the ITO is covered by 290 nm of insulating resin (TELR-P003 from Tokyo Ohka Kogyo).

The resin is then hardened by baking at 200° C. during 30 minutes, the substrate is cleaned by de-ionized water, and dried at 200° C. during 5 minutes, then put under vacuum at 180° C. during 20 minutes, before entering the vacuum deposition equipment (Sunicel Plus equipment, base pressure of 70 μPa). The ITO is then subjected to plasma treatment under oxygen during 3 minutes.

A group of stacked organic layers 3 is then deposited. The first organic layer is a doped hole transport layer of 35 nm (a spiro compound doped with 2% F4-TCNQ), deposited at 0.3 nm/s, followed by an electron blocking layer of 10 nm NPB, deposited at 0.1 nm/s. Then an emitting layer was deposited with a thickness of 38 nm (in sequence blue, green and red host+dopant, from Idemitsu and Covion). An hole blocking layer of 2 nm BPhen was then deposited at 0.15 nm/s, followed by an electron transport layer of 25 nm (BPhen doped (1.8%) with a proprietary dopant TND1. The obtained group of stacked organic layers 3 is adapted to emit a white visible light which is distributed in a range of wavelengths extending from 465 nm to 605 nm.

Finally a 120 nm layer of aluminum was deposited as a top electrode 4 acting as cathode (0.15 nm/s).

A glass cover with a recess for a getter was attached in a glove box (N2 atmosphere) to obtain the reference example 1 diode.

This reference diode was then evaluated by subjecting it to a DC current. The following results were then obtained: 6.2 cd/A at 100 cd/m$^2$, 6 lm/W, 3.3% for the quantum efficiency.

EXAMPLE 1

White Bottom Emitting Organic Diode According to the Invention

The same Asahi substrate 1 as for the reference example 1 above is subjected to the same photolithography steps, except that the TELR resin is not deposited. After cleaning in de-ionized water and drying at 200° C. during 5 minutes+ vacuum 180° C. during 20 minutes, the substrate) is transferred to the vacuum deposition equipment for deposition of a silver anode on top of the ITO layer. Here, the ITO layer is not necessary but used as a convenient base for its good surface smoothness. The ITO is subjected to plasma treatment under oxygen during 3 minutes, then an opaque layer of silver is deposited at 0.15 nm/s up to a thickness of 120 nm.

The silver layer is then subjected to 2.5 minutes of Ar plasma treatment, removed from the vacuum deposition equipment, and returns to the photolithography area for deposition of the same resin TELR; the active area of the bottom electrode 2 acting as an anode is now a free 3 mm disc of silver; on the inactive area the silver is covered by 290 nm of the insulating resin. After 30 minutes baking, the substrate is transferred again to the vacuum deposition equipment.

A group of stacked organic layers 3 is then deposited. The first organic layer deposited on silver is the same doped hole transport layer as in reference example 1 but has a thickness of 30 nm, followed by the same electron blocking layer of 10 nm NPB. Then exactly the same emitting layer as in reference example 1 was deposited (thickness of 38 nm). The same hole blocking layer of 2 nm BPhen was deposited, followed by the same electron transport layer with a thickness of 25 nm. The obtained group of stacked organic layers 3 is adapted to emit a white visible light that is distributed in a range of wavelengths extending from 465 nm to 605 nm. The center $\lambda_M$ of this range of wavelengths is then 535 nm.

Then 15 nm of silver was deposited at 0.1 nm/s to make the top electrode 4 acting as an anode, followed by the deposition of 145 nm of tellurium dioxide TeO2 (Sigma-Aldrich, 99% grade) to make the light-extraction enhancement layer 5 according to the invention, contacting the top electrode 4 on its entire surface. The averaged optical index $n_D$ of TeO2 within the range 465 nm-605 nm is between 2.3 and 2.4. Consequently, the value 145 nm of the thickness is equal to $5.\lambda_M/8.n_D$ with a margin of ±10%.

As above a glass cover with recess was attached in a glove box (N2 atmosphere) to obtain the example 1 diode.

This diode was then evaluated by subjecting it to a DC current. The following results were then obtained: 8.4 cd/A at 100 cd/m$^2$, 9 lm/W, 3.8% quantum efficiency.

The comparison of the results obtained for the example 1 diode with results obtained for the reference example 1 diode illustrates the improvement of light extraction for the entire range of emitted wavelength that is provided by the invention.

While the present invention has been described with respect to a particular example, it is understood that the present invention is not limited to this example. The present invention as claimed therefore includes variations from this particular example described herein, as will be apparent to one of skill in the art. While some of the specific embodiments may be described and claimed separately, it is understood that the various features of embodiments described and claimed herein may be used in combination.

The invention claimed is:

1. Group of at least one organic light emitting diode, wherein each diode of this group comprises, in an interval limited by a bottom electrode and a top electrode, at least one organic light-emitting layer that is adapted to emit visible light through one of said electrodes that is semi-transparent, wherein the light intensity of the emitted visible light encompassing the emitted visible light of all organic light-emitting layer(s) of the diode(s) of said group is distributed over a continuous range of wavelengths that is superior or equal to 150 nm, wherein a weighted average wavelength $\lambda_M$ is defined which corresponds to the average wavelength weighted across said continuous range by said light intensity, wherein said group comprises a light-extraction enhancement layer made of a dielectric material, which is located outside said interval of each diode of this group, which is directly adjacent to the electrode of each diode of this group that is semi-transparent, and wherein, if $n_D$ is the optical index of said dielectric material, the thickness of said light-extraction enhancement layer is equal to $5 \times \lambda_M/(8 \times n_D)$ with a margin of ±10%.

2. Group of at least one organic light emitting diode according to claim 1 wherein it comprises at least one organic light emitting diode having a plurality of stacked organic light-emitting layers.

3. Group of at least one organic light emitting diode according to claim 1, wherein said group comprises a plurality of adjacent organic light emitting diodes disposed side-by-side.

4. Organic light emitting diode or group of adjacent organic light emitting diodes according to claim 1, wherein said dielectric material is selected in the group consisting of $ZrO_2$, $LiNbO_3$, $SiO$, $SnO_2$, $PbF_2$ and $Sb_2O_3$.

5. Organic light emitting diode or group of adjacent organic light emitting diodes according to claim 1, wherein said dielectric material is selected in the group consisting of $ZnSe$, $ZnS$, $SnS$, $TeO_2$ and $TiO_2$.

6. Organic light emitting diode or group of adjacent organic light emitting diodes according to claim 1, wherein said interval(s) between electrodes is an optical cavity.

7. Lighting or display panel comprising a plurality of organic light emitting diodes according to claim 1.

* * * * *